(12) United States Patent
Moriya et al.

(10) Patent No.: US 7,122,280 B2
(45) Date of Patent: Oct. 17, 2006

(54) ANGULAR SUBSTRATES

(75) Inventors: Jiro Moriya, Niigata-ken (JP);
 Masataka Watanabe, Niigata-ken (JP);
 Satoshi Okazaki, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 221 days.

(21) Appl. No.: 10/214,113

(22) Filed: Aug. 8, 2002

(65) Prior Publication Data
US 2003/0031890 A1 Feb. 13, 2003

(30) Foreign Application Priority Data
Aug. 8, 2001 (JP) .............. 2001-240028

(51) Int. Cl.
 *H01L 21/44* (2006.01)
(52) U.S. Cl. .............. 430/5; 430/11; 451/41
(58) Field of Classification Search ........ 257/622, 257/730, 684; 430/5, 11; 451/41
See application file for complete search history.

(56) References Cited

U.S. PATENT DOCUMENTS

| 5,105,173 | A | * | 4/1992 | Itou ................... 333/204 |
|---|---|---|---|---|
| 5,849,636 | A | | 12/1998 | Harada et al. |
| 6,049,124 | A | | 4/2000 | Raiser et al. |
| 6,172,730 | B1 | * | 1/2001 | Fujita .................. 349/149 |
| 6,217,980 | B1 | * | 4/2001 | Takahashi et al. ........ 428/141 |
| 6,245,678 | B1 | * | 6/2001 | Yamamoto et al. ........ 438/692 |
| 6,406,589 | B1 | * | 6/2002 | Yanagisawa ............ 156/345.3 |
| 6,790,129 | B1 | * | 9/2004 | Moriya et al. ............ 451/41 |
| 2003/0031890 | A1 | * | 2/2003 | Moriya et al. ............ 428/620 |
| 2003/0036340 | A1 | * | 2/2003 | Moriya et al. ............ 451/41 |
| 2005/0208389 | A1 | * | 9/2005 | Ishibashi et al. ............ 430/5 |

FOREIGN PATENT DOCUMENTS

| EP | 0750335 A2 | 12/1996 |
|---|---|---|
| GB | 975960 | 11/1964 |
| WO | WO 98/44541 A1 | 10/1998 |

* cited by examiner

*Primary Examiner*—Laura M. Schillinger
(74) *Attorney, Agent, or Firm*—Birch, Stewart, Kolasch & Birch, LLP

(57) ABSTRACT

A square substrate has a pair of opposed major surfaces and peripheral end faces therebetween, wherein a tapered edge portion is disposed between the peripheral end face and each major surface to define an inner boundary with the major surface, and has a width of 0.2–1 mm from the peripheral end face. Both or either one of the major surfaces of the substrate has a flatness of up to 0.5 μm in an outside region of the substrate that extends between a position spaced 3 mm inward from the peripheral end face and the inner boundary of the tapered edge portion.

14 Claims, 5 Drawing Sheets

ANGULAR SUBSTRATES

BACKGROUND OF THE INVENTION

1. Field of the Invention

This invention relates to angular substrates for use in the semiconductor technology.

2. Prior Art

As the demand for higher DRAM integration level and smaller microcircuit geometry has continued to increase, so has the demand for chips of larger size. Accordingly, photomasks have a larger exposure region and are thus required to have a higher degree of flatness even to their periphery.

In one example wherein a square substrate is 152 mm×152 mm (6 inches) and a chip has a size of 30 mm, the exposure region of a photomask is 120 mm in the case of 4-fold reduction exposure, and reaches 150 mm in the case of 5-fold reduction exposure. In fact, it rarely happens that the substrate is utilized to the extremity of 150 mm as the exposure region. However, since alignment marks or the like are necessary outside the exposure region, a high degree of flatness is required even to the periphery of the substrate.

In another situation, a substrate is rested on a sample holder of an inspection instrument. For example, a substrate 1 is mounted on a sample holder in the form of spaced blocks 2 as shown in FIG. 8, or a substrate 1 is mounted on a sample holder in the form of pins 3 as shown in FIG. 9. In either case, the sample holder supports the substrate at its periphery. Since the exposure region is enlarged and alignment marks or the like are provided outside as mentioned above, the portion of the substrate which is available for attachment by the sample holder is shifted more outward.

As a result, not only the exposure region and the alignment mark-bearing region of a substrate, but also a peripheral region thereof is now required to have a certain degree of flatness. If the peripheral region of a substrate has a low degree of flatness, there would arise a problem that when the substrate is mounted on a sample holder, the substrate is not kept horizontal, causing a lowering of inspection sensitivity and a failure of reproduction.

Another problem arises when a resist solution is spin coated onto a substrate. For example, as shown in FIG. 10, a sample holder 6 is provided along the periphery of a stage 7. While the stage 7 with a substrate 1 mounted on its sample holder 6 is rotated, a resist solution is applied to the substrate 1 at the center. To prevent the substrate 1 from moving aside during the spin coating, the substrate 1 is secured to the stage 7 by vacuum chucking through a suction hole 8 in the stage 7. The sample holder 6 is often made of a synthetic resin such as polyacetal resin. In this case, the sample holder 6 supports the substrate along its periphery as well. If the substrate has a low degree of flatness at its periphery, the predetermined vacuum would not be reached upon vacuum suction and the precision of a resist coating surface would be adversely affected.

Referring to FIG. 1, a method for polishing an angular substrate using a general single-side polishing machine is described. A polishing turntable 13 includes a platen 11 and a polishing pad or cloth 12 attached thereto. An abrasive fluid 14 is fed to the polishing pad 12 at its center via an abrasive supply line 15. A substrate holding head 16 holds a substrate to be polished (not shown) and presses it against the polishing turntable 13. By independently rotating the turntable 13 and the substrate holding head 16 in this state, the substrate is polished.

FIG. 2 is a schematic view showing only the turntable 13 and the substrate to be polished 1. The substrate 1 is abraded while it rotates about its center. The substrate surface is then polished in a concentric pattern.

However, since corner areas (hatched areas in FIG. 2) 1a of the substrate 1 out of the inscribed circle are readily subject to the rapid removal of material, the corner areas 1a of the substrate 1 tend to undergo excessive polishing. This is due in part to differences across the substrate 1 in its relative velocity with the polishing turntable 13. The main reason why the corner areas 1a of the substrate 1 tend to undergo excessive polishing is explained by referring to FIG. 3 which is a schematic view showing only the polishing pad 12 and the substrate to be polished 1. When the substrate 1 is pressed against the polishing pad 12 during polishing, it sinks into the polishing pad 12 under the pressing force in the manner shown in FIG. 3. At the start of such sinking, the polishing pad 12 exerts an elastic force upon the substrate 1 to increase friction by the polishing pad 12, facilitating material removal in the corner areas 1a. In addition, because the substrate 1 is an angular substrate, the polishing pad 12 which polishes the corner areas 1a alternately undergoes the application and release of pressing forces from the substrate 1. Inversely, the substrate corner areas 1a have repeated chances of incurring the elastic forces of the polishing pad 12. As a result, the corner areas 1a are over-polished, leaving difficulties in achieving flatness across the corner areas 1a. In FIG. 3, the lengths of the arrows indicate the relative magnitude of the forces of restitution acting under the elasticity of the polishing pad 2.

SUMMARY OF THE INVENTION

An object of the invention is to provide an angular substrate which is fully flat and especially in its peripheral region.

According to the invention, there is provided an angular substrate having a pair of opposed major surfaces and peripheral end faces therebetween, wherein as viewed in a peripheral cross-section, a tapered edge portion is disposed between the peripheral end face and each major surface to define an outer boundary with the peripheral end face and an inner boundary with the major surface, and has a width within 1 mm from the peripheral end face. Both or either one of the major surfaces of the substrate has a flatness of up to 0.5 μm in an outside region of the substrate that extends from a position spaced 3 mm inward from the peripheral end face to the inner boundary of the tapered edge portion. Preferably, the flatness in the outside region is up to 0.3 μm.

In a preferred embodiment, both or either one of the major surfaces of the substrate has a flatness of up to 0.5 μm, more preferably up to 0.3 μm, in an inside region of the substrate that extends inward from the position spaced 3 mm inward from the peripheral end face.

The angular substrate is typically a square substrate sized 152 mm×152 mm.

An angular substrate including an outside region which is fully flat is obtainable by controlling the polishing rate of corner areas so as to prevent the corner areas from being over-polished.

BRIEF DESCRIPTION OF THE DRAWINGS

The objects, features and advantages of the invention will become more apparent from the following description, taken in conjunction with the accompanying drawings.

DESCRIPTION OF THE PREFERRED EMBODIMENTS

The angular substrates to which the invention relates include substrates of square, rectangular and other quadrangular shapes, as well as substrates of other polygonal shapes. A square substrate is used in the preferred embodiment to be described below.

Figure 4:
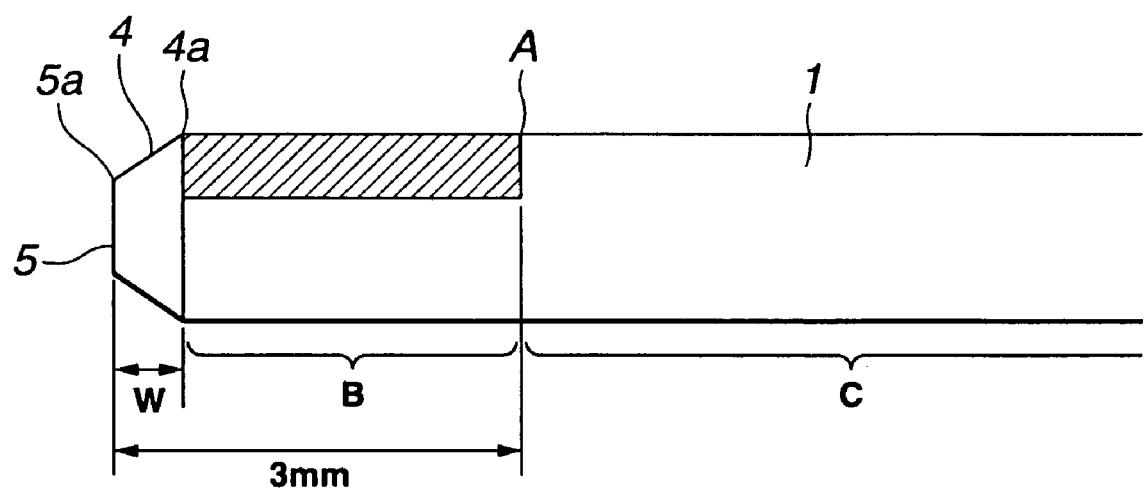
FIG. 4 is a cross-sectional view of a peripheral portion of an angular substrate according to the invention.

Referring to FIG. 4, which is a cross-sectional view of a peripheral portion of an angular substrate, the substrate 1 has a pair of opposed major surfaces and peripheral end faces therebetween (one end face 5 is shown). A tapered edge portion 4 is disposed between the peripheral end face 5 and each major surface to define an outer boundary 5a at its connection to the peripheral end face 5 and an inner boundary 4a at its connection to the major surface. The tapered edge portion 4 has a width W within 1 mm from the peripheral end face 5, as measured parallel to the major surface. The width W of the edge portion 4, which is the lateral distance between the peripheral end face 5 and the inner boundary 4a of the edge portion 4, is preferably in a range of 0.2 to 0.6 mm. According to the invention, in an outside region (hatched region in the figure) B of the substrate 1 that extends between a position A spaced 3 mm inward from the peripheral end face 5 and the inner boundary 4a of the edge portion 4, both or on, preferably both, of the major surfaces of the substrate 1 has a flatness of up to 0.5 µm and especially, up to 0.3 µm. It is preferred that in an inside region C of the substrate 1 that extends inward from the position A, both or either one, preferably both, of the major surfaces of the substrate 1 have a flatness of up to 0.5 µm and especially, up to 0.3 µm.

The angular substrate including an outside region having a high flatness according to the invention can be manufactured by holding a starting angular substrate within a segmented guide ring, pressing the angular substrate and the guide ring against a polishing pad or cloth, and independently rotating the substrate and the polishing pad for polishing the substrate with the pad, while adjusting the pressing force of guide ring segments in accordance with the degree of polishing of the substrate for thereby controlling the polishing rate.

Figure 1:
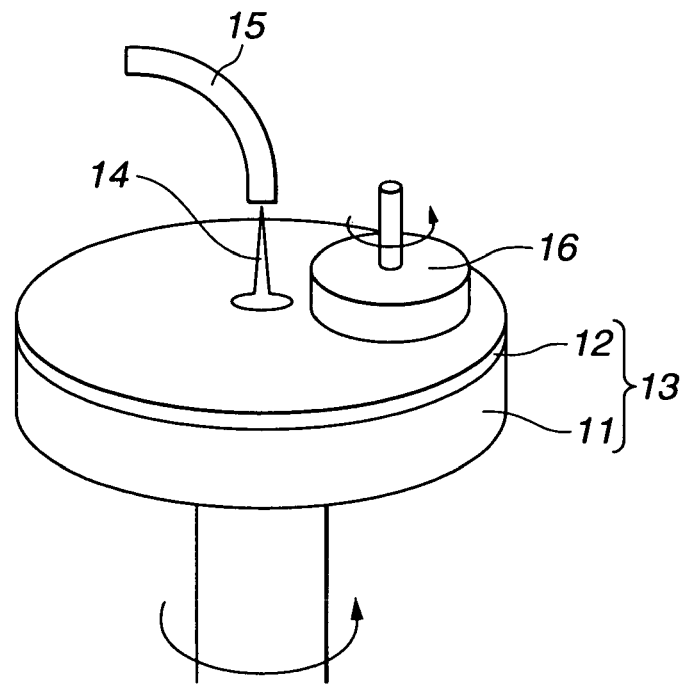
FIG. 1 is a perspective view of a single side polishing machine of polishing a substrate with a polishing pad.
Figure 2:
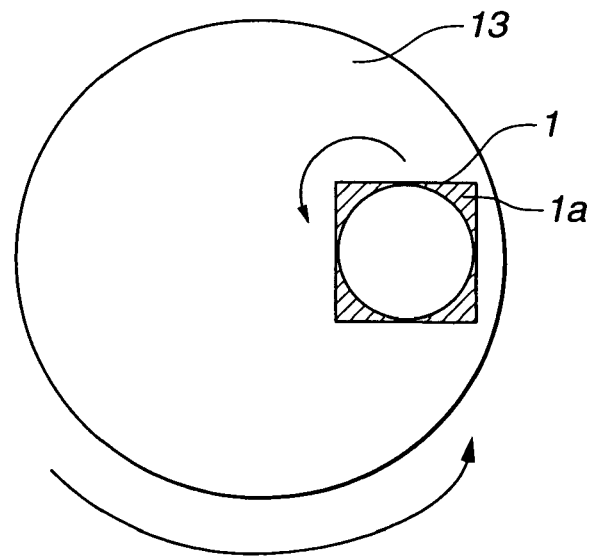
FIG. 2 illustrates a problem in the prior art for polishing an angular substrate.
Figure 3:
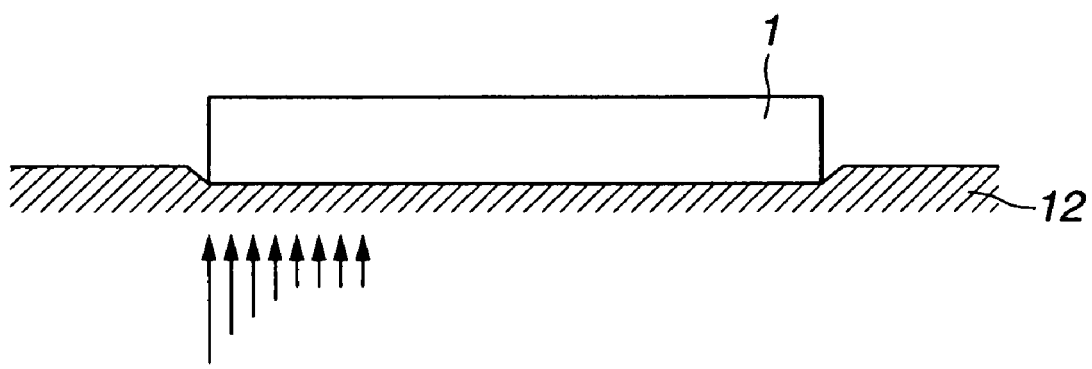
FIG. 3 is a sectional view showing the state of the polishing pad during polishing.
Figure 5:
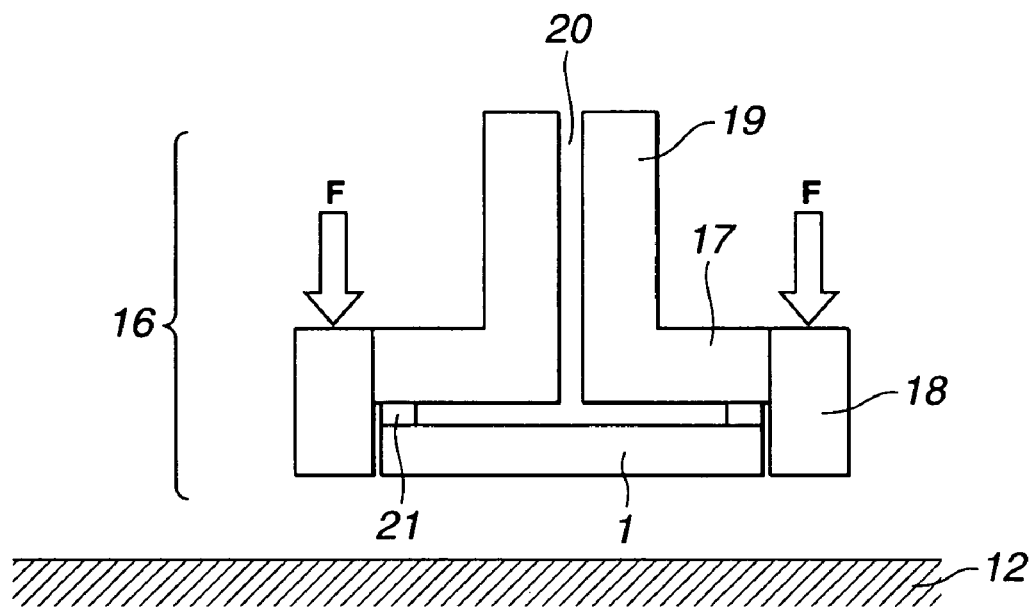
FIG. 5 is a sectional view of one exemplary substrate holding head.

For the single side polishing of angular substrates, the method shown in FIG. 1 is employable. Specifically, as shown in FIG. 5, a substrate holding head 16 has a planar top ring 17 of circular, quadrangular or other suitable shape which is provided on the periphery thereof with a guide ring 18. The top ring 17 has a cylinder 19 that rises up from the center of the outside face thereof. The top ring 17 and cylinder 19 have a fluid channel 20 which passes therethrough. A substrate to be polished (angular substrate) 1 located within the guide ring 18 is vacuum chucked to the inside face (holding face) of the top ring 17 by drawing a vacuum within the guide ring 18 through the fluid channel 20.

In the illustrated embodiment, the substrate 1 is vacuum chucked to the inside face of the top ring 17 through an elastomer or synthetic resin spacer 21. Suitable examples of the elastomer or synthetic resin for spacer 21 include silicone rubbers, nitrile rubbers, styrene-butadiene rubbers, fluoroelastomers, polyacetal resins and fluorocarbon resins. The elastomer or synthetic resin spacer 21 is placed between the peripheral edge on the back surface of the substrate 1 which plays no part in exposure and the peripheral edge on the inside face (holding face) of the top ring 17 of the substrate holding head 16. During polishing of the substrate 1, the elastomer or synthetic resin spacer 21 transfers the pressing force from the top ring 17 to the substrate 1. This arrangement makes it possible to keep scratches from forming on the back surface of the substrate 1 that is not polished. When the elastomer or synthetic resin spacer 21 is placed in this way directly against the peripheral edge of the substrate 1 and a pressing force is applied therethrough by the top ring 17 to the substrate 1, the force is directly transferred to the corner areas of the substrate 1, making corner areas more subject to polishing. In such cases, a uniform polishing load throughout the substrate 1 can be achieved by the application of pressure such as with air or nitrogen through the fluid channel 20. During the polishing, a load can be applied to the substrate 1 in order for the substrate holding head 16 to press the substrate 1 against the polishing pad 12. Polishing can be effected at this time by feeding a pressurizing gas such as air or nitrogen through the fluid channel 20 to apply pressure to the substrate.

The guide ring 18 is provided on the substrate holding head 16 to keep the position of the substrate 1 from shifting. The guide ring 18 is made of any desired material, for example, vinyl chloride resin, polyphenylene sulfide (PPS) or polyetheretherketone (PEEK).

Figure 6:
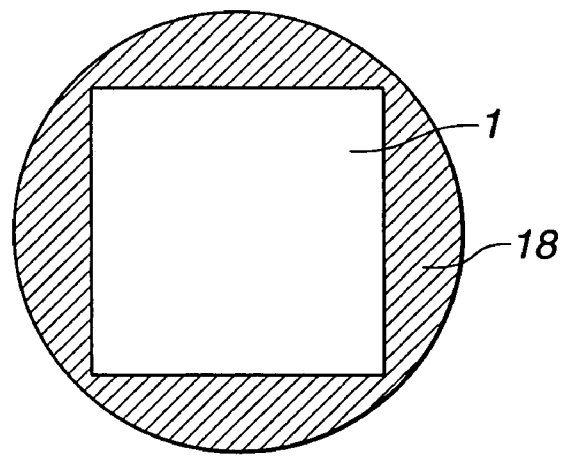
FIG. 6 is a schematic view of a guide ring.

In one preferred embodiment, the guide ring 18 is of a size which includes a circle of a diameter equal to the diagonal of the substrate 1 as shown in FIG. 6. This guide ring 18 is effective for equalizing the elastic forces exerted from the corner areas of the substrate 1 during the polishing operation for thereby preventing excessive polishing, but to a limited extent because the corner areas of the substrate 1 are more susceptible to polishing due to differential relative velocity and other factors.

Figure 7:
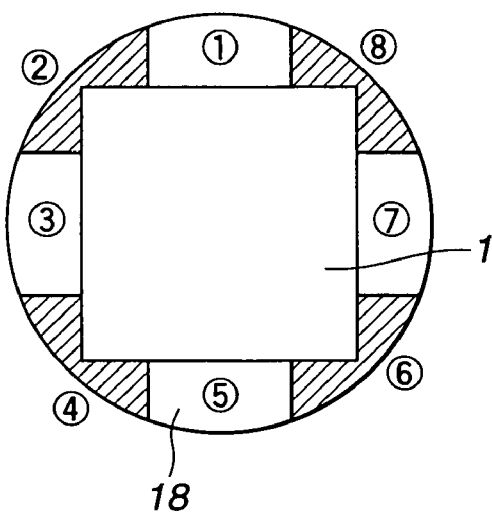
FIG. 7 is a schematic view of a divided guide ring.
Figure 8A:
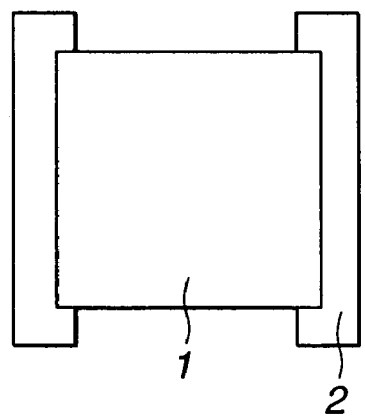
FIG. 8 illustrates a sample holder of a substrate inspecting instrument and a substrate held thereon, FIG. 8A being a plan view and FIG. 8B being a perspective view.
Figure 8B:
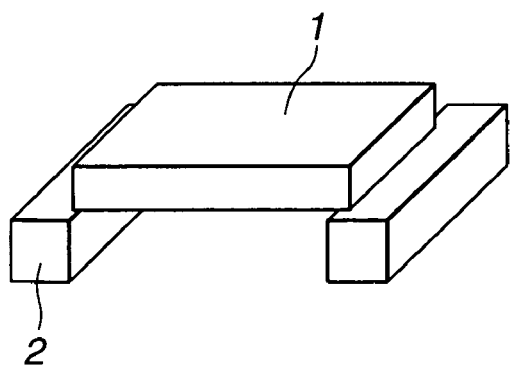
Figure 9A:
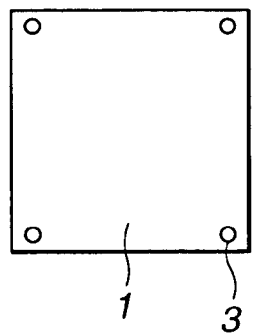
FIG. 9 illustrates a sample holder of another substrate inspecting instrument and a substrate held thereon, FIG. 9A being a plan view and FIG. 9B being a perspective view.
Figure 9B:
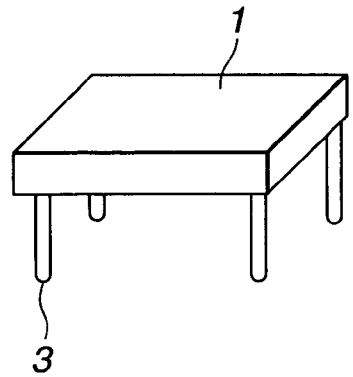
Figure 10A:
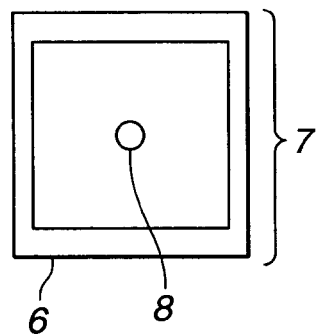
FIG. 10 illustrates a stage of holding a substrate for spin coating of a resist solution, FIG. 10A being a plan view, FIG. 10B being a sectional view, and FIG. 10C being a perspective view.
Figure 10B:
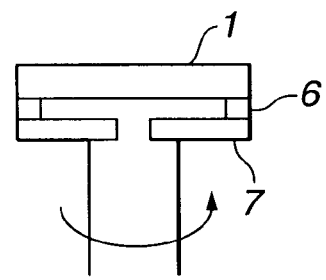
Figure 10C:
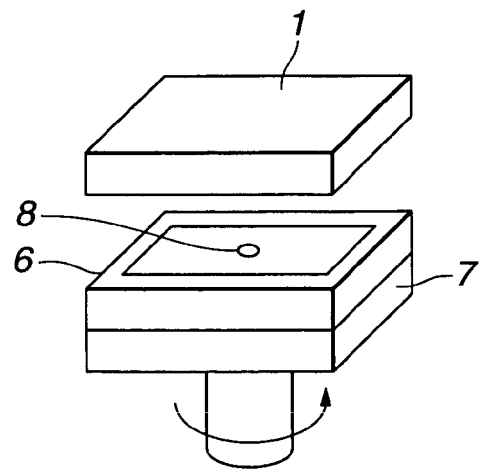

One solution employed in the practice of the invention is to carry out the polishing operation while pressing the substrate 1 against the polishing pad 12, and at the same time, abutting and pressing the front face of the guide ring 18 against the polishing pad 12. The guide ring 18 is divided into a plurality of segments. Specifically, as shown in FIG. 7, the guide ring 18 is divided into eight segments, four of the segments (2), (4), (6) and (8) being configured to apply pressing forces to respective corners of the substrate 1, and the remaining four segments (1), (3), (5) and (7) being configured to apply pressing forces to the centers of respective sides of the substrate 1. This setting enables to adjust the pressing forces at selected areas during the polishing operation for thereby controlling the polishing rate of corner areas.

When the pressing force of the guide ring 18 is smaller than that of the substrate 1, the polishing pad 12 under the guide ring 18 is sunk to a smaller depth than under the substrate 1. Then the corner areas of the substrate 1 receive slightly greater elastic forces from the polishing pad 12 and hence, a slightly higher polishing rate. Inversely, when the pressing force of the guide ring 18 is larger than that of the substrate 1, the corner areas of the substrate 1 incur a slightly lower polishing rate.

For example, a greater pressing force than that of the substrate 1 is applied to the segments (2), (4), (6), (8) of the guide ring 18 located near the corners of the substrate 1 where a higher polishing rate prevails, and a smaller pressing force than that of the substrate 1 is applied or no pressing force is applied to the segments (1), (3), (5), (7) of the guide ring 18 located near the centers of the sides of the substrate 1 where a lower polishing rate prevails. With this setting, the in-plane polishing rate can be adjusted, achieving a high flatness in peripheral portions of the substrate.

The angular substrate obtained by the above-mentioned method has one surface polished to a flatness of not more than 0.5 μm, preferably not more than 0.3 μm, in the outside region of the substrate that extends 3 mm inward from the peripheral end face. Especially, the substrate surface has an in-plane flatness of not more than 0.5 μm, preferably not more than 0.3 μm, in the inside region of the substrate excluding the outside region.

The use of angular substrates as specified above ensures a consistent sensitivity and higher reproducibility for the inspection of angular substrates by an inspection instrument. Photomasks produced from such angular substrates ensure high precision of alignment in a stepper so that images of high-density integrated circuits such as LSI and VLSI may be transferred onto wafers in a reproducible and stable manner. Also, when used in the resist coating step, the substrates ensure stable operation during rotation thereof, resulting in improved precision of a resist coating surface.

EXAMPLES

Examples are given below by way of illustration and not by way of limitation.

Example 1

The substrate to be polished was a square substrate of 152 mm×152 m×6.35 mm thick which included an edge portion having a width of 0.5 mm.

A single-side polishing machine with a guide ring divided into eight segments as shown in FIG. 7 was used. The pressing force applied to the substrate was 20 kPa. The pressing force applied to the guide ring segments (2), (4), (6), (8) located near the corners of the substrate was 30 kPa. The pressing force applied to the guide ring segments (1), (3), (5), (7) located near the centers of the sides of the substrate was 5 kPa. A suede-type polishing pad was used, and colloidal silica was used as the abrasive fluid. Polishing under these conditions yielded a substrate having a flatness of not more than 0.3 μm in the inside region C extending inward from the position spaced 3 mm from the peripheral end face, that is, the region of 146 mm×146 mm, and a flatness of not more than 0.5 μm in the outside region B (see FIG. 4).

The flatness of the substrate was measured using a ZYGO Mark IV flatness tester capable of measurement over the entire surface (supplied by ZYGO Co.).

According to the invention, an angular substrate including an outside region having a flatness of up to 0.5 μm is obtainable by holding a starting angular substrate within a segmented guide ring, pressing the angular substrate and the guide ring against a polishing pad, and independently rotating the substrate and the polishing pad for polishing the substrate with the pad, while controlling the pressing force of guide ring segments in accordance with the polishing rate of different areas of the substrate. The invention ensures consistent sensitivity and reproducibility for inspection by a substrate inspection instrument and drastically improves the precision of alignment in a stepper. Also, the substrates ensure stable operation during the resist coating step, resulting in improved precision of a resist coating surface.

Japanese Patent Application No. 2001-240028 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An angular photomask substrate having a pair of opposed major surfaces and peripheral end faces therebetween, wherein as viewed in a peripheral cross-section, a tapered edge portion is disposed between the peripheral end face and each major surface to define an inner boundary with the major surface, and the tapered edge portion is disposed within 1 mm from the peripheral end face as measured parallel to the major surface, and both or either one of said major surfaces of the substrate has a flatness of up to 0.5 μm in an outside region of the substrate that extends from a position spaced 3 mm inward from the peripheral end face to the inner boundary of the tapered edge portion.

2. The angular photomask substrate of claim 1 wherein the flatness in the outside region is up to 0.3 μm.

3. The angular photomask substrate of claim 1 wherein both or either one of said major surfaces of the substrate has a flatness of up to 0.5 μm in an inside region of the substrate that extends inward from the position spaced 3 mm inward from the peripheral end face.

4. The angular photomask substrate of claim 3 wherein the flatness in the inside region is up to 0.3 μm.

5. The angular photomask substrate of claim 1 which is sized 152 mm×152 mm.

6. A quadrangular-shaped photomask substrate having a pair of opposed major surfaces and peripheral end faces therebetween, wherein as viewed in a peripheral cross-section, a tapered edge portion is disposed between the peripheral end face and each major surface to define an inner boundary with the major surface, and the tapered edge portion is disposed within 1 mm from the peripheral end face, as measured parallel to the major surface, and both or either one of said major surfaces of the substrate has a flatness of up to 0.5 μm in an outside region of the substrate that extends from a position spaced 3 mm inward from the peripheral end face to the inner boundary of the tapered edge portion.

7. The quadrangular-shaped photomask substrate of claim 6, wherein the flatness in the outside region is up to 0.3 μm.

8. The quadrangular-shaped photomask substrate of claim 6, wherein both or either one of said major surfaces of the substrate has a flatness of up to 0.5 μm in an inside region of the substrate that extends inward from the position spaced 3 mm inward from the peripheral end face.

9. The quadrangular-shaped photomask substrate of claim 8, wherein the flatness in the inside region is up to 0.3 μm.

10. The quadrangular-shaped photomask substrate of claim 6 which is sized 152 mm×152 mm.

11. The angular photomask substrate of claim 5 wherein the inside region is sized 146 mm×146 mm.

12. The quadrangular-shaped photomask substrate of claim 10 wherein the inside region is sized 146 mm×146 mm.

13. The angular photomask substrate of claim 1, wherein the tapered edge portion is disposed within 0.2 to 0.6 mm from the peripheral end face as measured parallel to the major surface.

14. The quadrangular-shaped photomask substrate of claim 6, wherein the tapered edge portion is disposed within 0.2 to 0.6 mm from the peripheral end face as measured parallel to the major surface.

* * * * *